US008696814B2

(12) United States Patent
Morisaki et al.

(10) Patent No.: US 8,696,814 B2
(45) Date of Patent: Apr. 15, 2014

(54) FILM DEPOSITION APPARATUS AND FILM DEPOSITION METHOD

(75) Inventors: Eisuke Morisaki, Tsukui-Gun (JP); Hirokatsu Kobayashi, Nirasaki (JP); Jun Yoshikawa, Nirasaki (JP); Ikuo Sawada, Nirasaki (JP); Tsunenobu Kimoto, Kyoto (JP); Noriaki Kawamoto, Kyoto (JP); Masatoshi Aketa, Kyoto (JP)

(73) Assignees: Tokyo Electron Limited, Tokyo (JP); Rohm Co., Ltd., Kyoto-shi (JP)

( * ) Notice: Subject to any disclaimer, the term of this patent is extended or adjusted under 35 U.S.C. 154(b) by 505 days.

(21) Appl. No.: 12/519,933

(22) PCT Filed: Nov. 29, 2007

(86) PCT No.: PCT/JP2007/073074
§ 371 (c)(1),
(2), (4) Date: Jun. 18, 2009

(87) PCT Pub. No.: WO2008/078503
PCT Pub. Date: Jul. 3, 2008

(65) Prior Publication Data
US 2010/0092666 A1    Apr. 15, 2010

(30) Foreign Application Priority Data

Dec. 25, 2006  (JP) ................................. 2006-348502

(51) Int. Cl.
| C23C 16/52 | (2006.01) |
| C23C 16/455 | (2006.01) |
| C23C 16/46 | (2006.01) |
| H01L 21/306 | (2006.01) |
| C23F 1/00 | (2006.01) |
| C23C 16/06 | (2006.01) |
| C23C 16/22 | (2006.01) |

(52) U.S. Cl.
USPC ...... 118/725; 118/666; 118/724; 156/345.26; 156/345.52; 156/345.53

(58) Field of Classification Search
USPC ........ 118/725, 666, 724; 156/345.26, 345.52, 156/345.53
See application file for complete search history.

(56) References Cited

U.S. PATENT DOCUMENTS 2,884,467 A * 4/1959 Denison et al. ................ 570/150
3,180,917 A * 4/1965 Morrison et al. ............. 219/634

(Continued)

FOREIGN PATENT DOCUMENTS

| JP | 55003632 A * 1/1980 ............ H01L 21/205 |
| JP | 60123022 A * 7/1985 ............ H01L 21/205 |

(Continued)

OTHER PUBLICATIONS

Japanese Office Action issued Apr. 17, 2012 in Patent Application No. 2006-348502 with English Translation.

*Primary Examiner* — Rudy Zervigon
(74) *Attorney, Agent, or Firm* — Oblon, Spivak, McClelland, Maier & Neustadt, L.L.P.

(57) ABSTRACT

A disclosed film deposition apparatus includes a process chamber inside which a reduced pressure space is maintained; a gas supplying portion that supplies a film deposition gas to the process chamber; a substrate holding portion that is made of a material including carbon as a primary constituent and holds a substrate in the process chamber; a coil that is arranged outside the process chamber and inductively heats the substrate holding portion; and a thermal insulation member that covers the substrate holding portion and is arranged to be separated from the process chamber, wherein the reduced pressure space is separated into a film deposition gas supplying space to which the film deposition gas is supplied and a thermal insulation space defined between the substrate holding portion and the process chamber, and wherein a cooling medium is supplied to the thermal insulation space.

12 Claims, 9 Drawing Sheets

(56) References Cited

U.S. PATENT DOCUMENTS

| | | | | |
|---|---|---|---|---|
| 3,213,177 A * | 10/1965 | Diefendorf | | 373/132 |
| 3,350,494 A * | 10/1967 | Fomin et al. | | 373/140 |
| 3,549,847 A * | 12/1970 | Brown et al. | | 219/634 |
| 3,674,904 A * | 7/1972 | Jung | | 373/111 |
| 3,845,738 A * | 11/1974 | Berkman et al. | | 118/725 |
| 3,980,854 A * | 9/1976 | Berkman et al. | | 219/634 |
| 4,263,087 A * | 4/1981 | Tanabe et al. | | 117/101 |
| 4,339,645 A * | 7/1982 | Miller | | 219/634 |
| 4,490,828 A * | 12/1984 | Fukuhara et al. | | 373/117 |
| 4,579,080 A * | 4/1986 | Martin et al. | | 118/500 |
| 4,732,110 A * | 3/1988 | Parsons | | 118/719 |
| 4,753,192 A * | 6/1988 | Goldsmith et al. | | 118/725 |
| 4,926,793 A * | 5/1990 | Arima et al. | | 118/730 |
| 5,064,367 A * | 11/1991 | Philipossian | | 432/253 |
| 5,458,685 A * | 10/1995 | Hasebe et al. | | 118/724 |
| 5,478,397 A * | 12/1995 | Shibata et al. | | 118/724 |
| 5,484,484 A * | 1/1996 | Yamaga et al. | | 118/719 |
| 5,540,782 A * | 7/1996 | Miyagi et al. | | 118/724 |
| 5,592,581 A * | 1/1997 | Okase | | 392/418 |
| 5,603,772 A * | 2/1997 | Ide | | 118/724 |
| 5,750,436 A * | 5/1998 | Yamaga et al. | | 438/558 |
| 5,870,526 A * | 2/1999 | Aschner et al. | | 392/416 |
| 5,884,009 A * | 3/1999 | Okase | | 392/418 |
| 6,228,174 B1 * | 5/2001 | Takahashi | | 118/725 |
| 6,299,683 B1 * | 10/2001 | Rupp et al. | | 117/88 |
| 6,338,756 B2 * | 1/2002 | Dietze | | 117/97 |
| 6,693,264 B2 * | 2/2004 | Anderhuber et al. | | 219/632 |
| 6,702,901 B2 * | 3/2004 | Buschbeck et al. | | 118/733 |
| 7,048,802 B2 * | 5/2006 | Kaeppeler et al. | | 118/725 |
| 7,118,781 B1 * | 10/2006 | Sumakeris et al. | | 427/248.1 |
| 7,390,367 B1 * | 6/2008 | Sumakeris et al. | | 118/725 |
| 7,740,703 B2 * | 6/2010 | Hasegawa et al. | | 118/715 |
| 8,062,426 B2 * | 11/2011 | Kappeler et al. | | 118/725 |
| 8,075,692 B2 * | 12/2011 | Osborne et al. | | 118/715 |
| 8,163,088 B2 * | 4/2012 | Lamouroux et al. | | 118/715 |
| 8,328,943 B2 * | 12/2012 | Morisaki et al. | | 118/724 |
| 2004/0007187 A1 * | 1/2004 | Kappeler et al. | | 118/730 |
| 2004/0020436 A1 * | 2/2004 | Kaeppeler et al. | | 118/724 |
| 2006/0126700 A1 * | 6/2006 | Wilcox et al. | | 373/151 |
| 2007/0101939 A1 * | 5/2007 | Sumakeris et al. | | 118/724 |
| 2008/0092817 A1 * | 4/2008 | Kappeler et al. | | 118/723 E |
| 2010/0015359 A1 * | 1/2010 | Morisaki et al. | | 427/591 |
| 2010/0047448 A1 * | 2/2010 | Morisaki et al. | | 427/248.1 |
| 2010/0092666 A1 * | 4/2010 | Morisaki et al. | | 427/248.1 |

FOREIGN PATENT DOCUMENTS

| | | | | |
|---|---|---|---|---|
| JP | 63060199 A * | 3/1988 | | C30B 29/36 |
| JP | 01083599 A * | 3/1989 | | C30B 25/14 |
| JP | 01220390 A * | 9/1989 | | H05B 6/10 |
| JP | 3 243776 | 10/1991 | | |
| JP | 6 57433 | 3/1994 | | |
| JP | 06057433 A * | 3/1994 | | |
| JP | 9 232275 | 9/1997 | | |
| JP | 11-157988 | 6/1999 | | |
| JP | 2003 166059 | 6/2003 | | |
| JP | 2004-35971 | 2/2004 | | |
| JP | 2004 323900 | 11/2004 | | |
| JP | 2008130682 A * | 6/2008 | | |
| WO | 01/14619 A1 | 3/2001 | | |
| WO | WO 2006/024572 A1 | 3/2006 | | |

* cited by examiner

FIG.2

| MATERIAL | Si | GaAs | SiC |
|---|---|---|---|
| BANDGAP $E_g$ | 1.12 eV | 1.43 eV | 3.26 eV |
| RELATIVE PERMITTIVITY $\varepsilon$ | 11.8 | 12.8 | 10 |
| ELECTRON MOBILITY $\mu$ | 1350 cm$^2$/Vs | 8500 cm$^2$/Vs | 1000 cm$^2$/Vs |
| ELECTRIC FIELD STRENGTH AT DIELECTRIC BREAKDOWN $E_c$ | 3.0 × 10$^5$ V/cm | 4.0 × 10$^5$ V/cm | 2.5 × 10$^6$ V/cm |
| SATURATED ELECTRON DRIFT VELOCITY $V_s$ | 1.0 × 10$^7$ cm/s | 2.0 × 10$^7$ cm/s | 2.2 × 10$^7$ cm/s |
| THERMAL CONDUCTIVITY $\chi$ | 1.5 W/cmK | 0.5 W/cmK | 4.9 W/cmK |

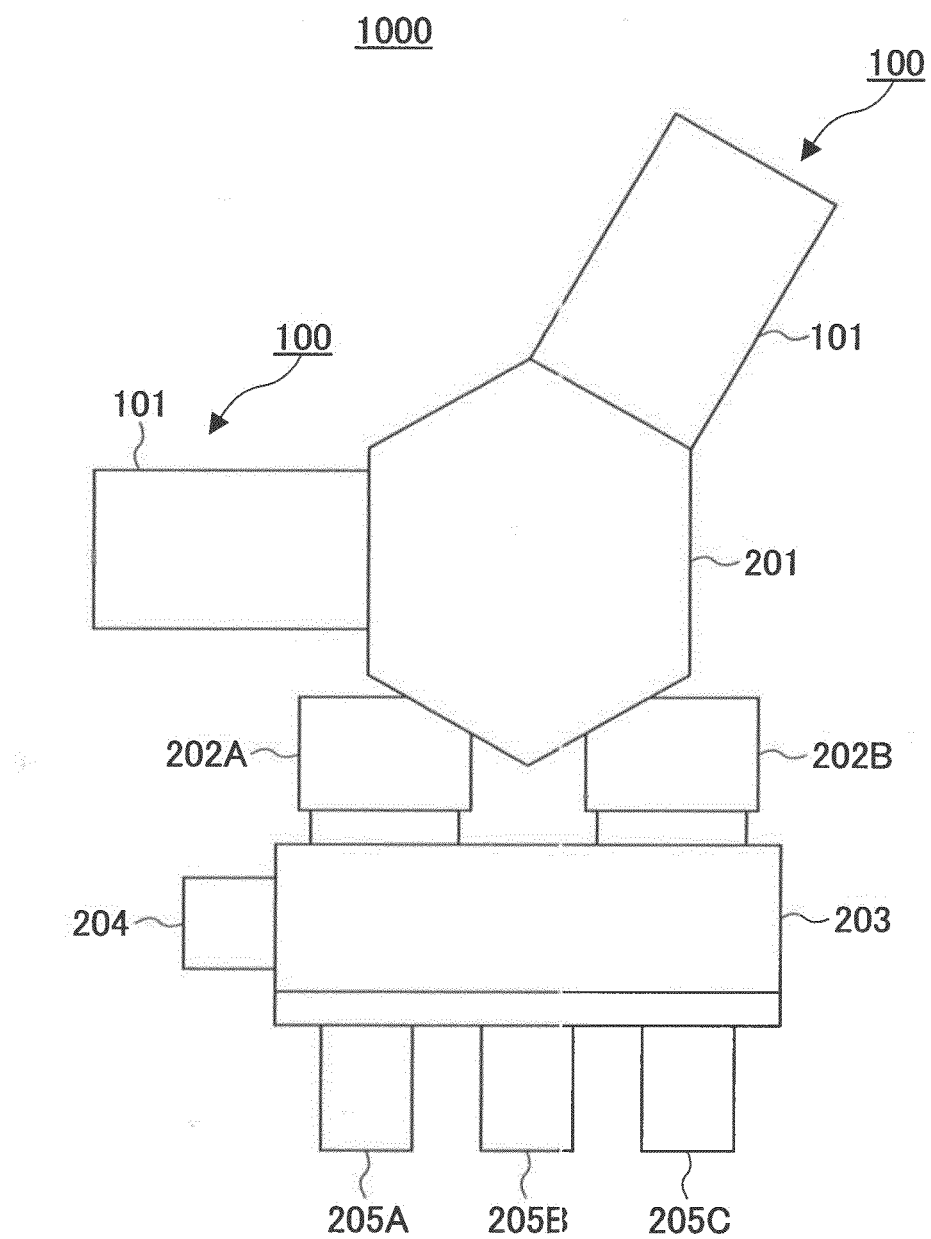

FILM DEPOSITION APPARATUS AND FILM DEPOSITION METHOD

TECHNICAL FIELD

The present invention relates to a film deposition apparatus and a deposition method where film deposition on a substrate is performed using induction heating.

BACKGROUND ART

An epitaxial growth method can grow a single crystal on a substrate so that the single crystal has the same crystal orientation as the crystal orientation of a substrate crystal, and is employed in various situations.

For example, the below-listed Patent Document 1 and Patent Document 2 disclose a silicon wafer fabricating method in which Si is grown by the epitaxial deposition method.

In the above epitaxial growth method, the substrate on which a predetermined film is to be grown is preferably uniformly heated at a temperature higher than the decomposition temperature of a source gas in order to thermally decompose the source gas.

Patent Document 1: Japanese Patent Application Laid-Open Publication No. H9-232275.
Patent Document 2: Japanese Patent Application Laid-Open Publication No. 2004-323900.

SUMMARY OF INVENTION

Problems to be Solved by the Invention

However, some source gases have high thermal decomposition temperatures, and when such source gases are used, a problem may be caused in terms of a configuration of the film deposition apparatus. For example, a commonly-used film deposition apparatus is configured so that the substrate to be used for film deposition may be held in a process chamber whose inner space is maintained at reduced pressures.

Here, when the substrate is heated to a temperature at which a film deposition gas having a high decomposition temperature is decomposed, process chamber walls are accordingly heated and the process chamber may be damaged. Moreover, contaminant substances that may serve as a contamination source for the film deposited on the substrate may be discharged from the process chamber by the heat, depending on the material of the process chamber.

When induction heating is employed using a coil arranged outside the process chamber, the process chamber is preferably configured with materials having low dielectric loss (permittivity) in order not to be heated.

In order to solve the above problem, it is necessary to configure the film deposition apparatus having a process chamber that does not discharge the substances that may serve as a contamination source even if heated to high temperatures, is free from a problem of the dielectric loss in induction heating, and is not damaged by heating. However, it is difficult to satisfy all of these demands.

A general objective of the present invention is to provide a novel and useful film deposition apparatus and film deposition method that are capable of solving the above problem.

A specific objective is to provide a film deposition apparatus and film deposition method that are capable of stably decomposing a film deposition gas having a high decomposition temperature by employing induction heating in order to perform film deposition.

Means of Solving the Problems

According to a first aspect of the present invention, there is provided a film deposition apparatus including a process chamber inside which a reduced pressure space is maintained; a gas supplying portion that supplies a film deposition gas to the process chamber; a substrate holding portion that is made of a material including carbon as a primary constituent and holds a substrate in the process chamber; a coil that is arranged outside the process chamber and inductively heats the substrate holding portion; and a thermal insulation member that covers the substrate holding portion and is arranged to be separated from the process chamber, wherein the reduced pressure space is separated into a film deposition gas supplying space to which the film deposition gas is supplied and a thermal insulation space defined between the substrate holding portion and the process chamber, and wherein a cooling medium is supplied to the thermal insulation space.

According to a second aspect of the present invention, there is provided a film deposition apparatus according to the first aspect, wherein the thermal insulation member is made of a porous material including carbon as a primary constituent, thereby differentiating a thermal conductivity of the thermal insulation member from a thermal conductivity of the substrate holding portion.

According to a third aspect of the present invention, there is provided a film deposition apparatus according to the second aspect, wherein a carbon-based coating film is formed on a surface of the thermal insulation member.

According to a fourth aspect of the present invention, there is provided a film deposition apparatus according to any one of the first through the third aspects, wherein the process chamber is made of quartz.

According to a fifth aspect of the present invention, there is provided a film deposition apparatus according to any one of the first through the fourth aspects, wherein the substrate holding portion includes a susceptor that is to be heated and may hold plural of the substrates, and a structure that is to be heated and may be formed around the susceptor, wherein the structure includes two openings opposing each other, and wherein the film deposition gas is supplied from one of the two openings and evacuated from the other opening.

According to a sixth aspect of the present invention, there is provided a film deposition apparatus according to the fifth aspect, wherein the susceptor may hold a transfer plate on which the plural substrates are placed, and wherein the susceptor is configured to rotate the transfer plate around a predetermined rotation axis.

According to a seventh aspect of the present invention, there is provided a film deposition apparatus recited claim 6, wherein the process chamber is connected to a transfer chamber having inside thereof a transfer portion, and wherein the transfer plate is transferred onto or out from the susceptor by the transfer portion.

According to an eighth aspect of the present invention, there is provided a film deposition apparatus according to any one of the first through the seventh aspects, further comprising a thermal insulation member holding structure that covers the thermal insulation member.

According to a ninth aspect of the present invention, there is provided a film deposition apparatus according to any one of the first through the eighth aspects, wherein a film corresponding to the film deposition gas is formed on the substrate.

According to a tenth aspect of the present invention, there is provided a film deposition method for forming a predetermined film on a substrate by using a film deposition apparatus according to any one of the first through the eighth aspects.

The film deposition method includes steps of placing the plural substrates on a transfer plate; transferring the transfer plate on which the plural substrates are placed onto a susceptor to be heated, the susceptor being included in the substrate holding portion; rotating the susceptor at a predetermined rate; supplying the film deposition gas to the film deposition gas supplying space; heating the substrate holding portion by the coil; and transferring the transfer plate on which the plural substrates are placed out from the process chamber.

According to an eleventh aspect of the present invention, there is provided a film deposition method recited according to the tenth aspect, further comprising a step of supplying a cooling medium that cools the process chamber to the thermal insulation space of the film deposition apparatus.

According to a twelfth aspect of the present invention, there is provided a film deposition method according to the tenth or the eleventh aspect, wherein the film deposition gas includes a gas having Si and C as primary constituents.

According to a thirteenth aspect of the present invention, there is provided a film deposition method according to any one of the tenth through the twelfth aspects, wherein the film deposition gas includes a gas denoted by CxHy (x, y: integer).

According to a fourteenth aspect of the present invention, there is provided a film deposition method according to any one of the tenth through the thirteenth aspects, wherein the substrate holding portion is inductively heated so that the substrates are heated at 1200° C. or more in the step of heating the substrate holding portion.

Effects of the Invention

According to an embodiment of the present invention, a film deposition apparatus and film deposition method that are capable of stably decomposing a film deposition gas having a high decomposition temperature by employing induction heating in order to perform film deposition are provided.

BRIEF DESCRIPTION OF THE DRAWINGS

FIG. 2 is a table comparing characteristics of semiconductor materials.

FIG. 9 is a view illustrating an example of connecting plural process chambers to a transfer chamber.

Figure 1:
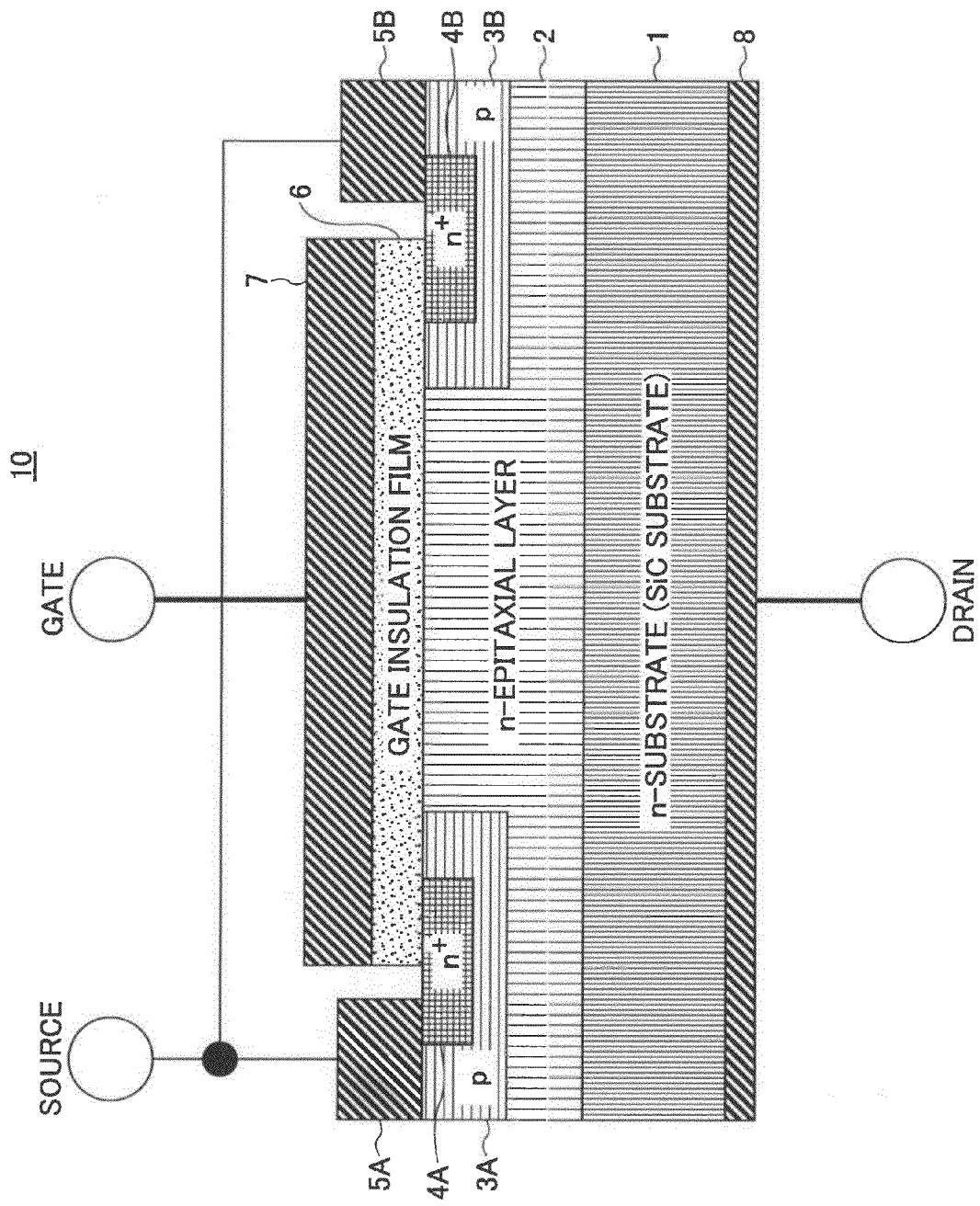
FIG. 1 is a cross-sectional view illustrating an example of a semiconductor device fabricated through an epitaxial growth method.

DESCRIPTION OF THE REFERENCE NUMERALS 101 process chamber
101A reduced pressure space
101B process chamber
101C gas supplying portion
101a film deposition gas supplying space
101b thermal insulation space
102 substrate holding portion
103 susceptor
104 structure-to-be-heated
105 thermal insulation member
106 thermal insulation member holding structure
107 coil
108 shaft portion
109 driving portion
110 transfer plate
111 pressure gauge
112 evacuation line
113 pressure adjuster
114 evacuation portion
120 control portion
121 CPU
122 memory medium
123 input portion
124 memory
125 communications portion
126 display portion
130, 130A through 130G, 134 gas lines
131A through 131G, 135 MFCs
132A through 132G, 136 valve
133A through 133G, 137 gas supplying source

MODE(S) FOR CARRYING OUT THE INVENTION

Referring to the accompanying drawings, exemplary embodiments of the present invention will now be described. In all the accompanying drawings, the same or corresponding reference symbols are given to the same or corresponding members or components. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

FIG. 1 is a view illustrating an example of a configuration of a semiconductor device (metal oxide semiconductor (MOS) transistor) fabricated through an epitaxial growth method.

Referring to FIG. 1, a semiconductor device 10 has a substrate 1 composed of an n-type silicon carbide semiconductor (SiC, hereinafter), and an n-type SiC layer (n-type epitaxial layer) 2 formed on the substrate 1 (a surface of the substrate 1). The SiC layer 2 is formed on the substrate crystal by an epitaxial growth method so that the SiC layer 2 has the same crystal orientation as the crystal orientation of the substrate crystal and is single crystalline. However, in other embodiments, depending on the characteristics of the semiconductor device 10 fabricated by a film deposition apparatus 100, the SiC layer 2 does not necessarily need to have the same crystal orientation as the crystal orientation of the substrate crystal, and may be polycrystalline.

P-type impurity diffusion regions 3A and 3B are formed leaving a predetermined clearance, and n-type impurity regions 4A and 4B are formed within the p-type impurity diffusion regions 3A and 3B, respectively. In addition, a gate insulation film 6 is formed on the SiC layer 2 so that the gate insulation film 6 extends from a part of the n-type impurity diffusion region 4A to a part of the n-type impurity diffusion region 4B. An electrode 7 is formed on the gate insulation film 6.

Moreover, an electrode 5A is formed on the p-type impurity diffusion region 3A and the n-type impurity diffusion region 4A, and an electrode 5B is similarly formed on the p-type impurity diffusion region 3B and the n-type impurity diffusion region 4B. Moreover, an electrode 8 is formed on a surface (back surface) of the substrate 1, the surface being opposite to the SiC layer 2.

In the above semiconductor device (MOS transistor) 10, the electrode 7 serves as a gate electrode, the electrodes 5A and 5B serve as source electrodes, and the electrode 8 serves as a drain electrode.

The above semiconductor device 10 is advantageous in that a so-called ON resistance (resistivity of a drift layer) can be greatly suppressed compared with a conventional semiconductor device using, for example, Si. With this, an effect is demonstrated that electricity usage efficiency is improved.

FIG. 2 is a table comparing characteristics of Si, GaAs, and SiC, which are used as semiconductor materials.

Referring to FIG. 2, it is understood that SiC has an advantage of a greater electric field strength Ec at which insulation breakdown occurs by an order of magnitude one or more than Si, which has conventionally been used for fabricating a semiconductor device. Because the above-mentioned ON resistance is inversely proportional to the cube of the electric field strength at insulation breakdown, the ON resistance is reduced and thus the electricity usage efficiency can be improved in the semiconductor device using SiC having a greater electric field strength Ec at insulation breakdown.

Moreover, because SiC has a wide bandgap compared with Si and GaAs, a semiconductor device using SiC can operate in high temperatures. For example, the semiconductor device fabricated with SiC can operate in high temperatures more than or equal to 400° C., while the maximum operational temperature of the semiconductor device fabricated with Si is about 150° C.

For this reason, according to the semiconductor device using SiC, any cooling devices that have conventionally been necessary for the semiconductor device becomes unnecessary. In addition, such a semiconductor device can be used in severe conditions, compared with the conventional device.

Moreover, regarding a so-called power device handling large currents, it becomes possible by employing SiC having a small resistance in order to reduce the device area, thereby realizing miniaturization of the apparatus employing this device.

SiC can be formed, for example, by an epitaxial growth method. In this method, an example of combination of gases employed for film deposition of SiC is $SiH_4$ and $H_2$. In addition to these gases, hydrocarbon gases ($C_xH_y$ (x and y are integers)) such as $C_3H_8$ that is difficult to be decomposed may be employed. Moreover, when $C_3H_8$ was used, for example, the substrate needs to be heated at a temperature more than or equal to 1200° C., and when the substrate is heated at such high temperatures, a following problem may be caused.

For example, a general film deposition apparatus is configured so that the substrate to be used for film deposition is held in the process chamber. The inside of the process chamber is maintained at reduced pressures, and a predetermined film is formed on the substrate.

Here, when the substrate is to be heated at about a temperature more than or equal at 1200° C. at which a film deposition gas (hydrocarbon gas) is decomposed, processing chamber walls are accordingly heated, and thus it becomes difficult to keep low temperatures at inner walls of the process chamber (or to realize a so-called cold wall system). Moreover, when the process chamber is locally heated from inside in such a manner, there may be caused damage (crack or the like) by thermal stress, depending on a material of the process chamber. Furthermore, contaminant substances for the film formed on the substrate may be discharged by heating the process chamber, depending on the material of the process chamber.

Moreover, when induction heating is employed using a coil arranged outside the process chamber, the process chamber is preferably configured with materials, for example, quartz (quartz glass) having low dielectric loss (dielectric constant) in order not to be heated.

In order to solve the above problem, it is necessary to configure the film deposition apparatus having a process chamber that does not discharge the substances that may serve as a contamination source even if heated to high temperatures, is free from a problem of the low dielectric loss in induction heating, and is not damaged by heating. However, it is difficult to satisfy all of these demands.

Then, a thermal insulation member which thermally insulates the substrate holding portion from the process chamber is provided in the process chamber in the film deposition apparatus according to an embodiment of the present invention. Therefore, even if the substrate (the substrate holding portion) is heated at high temperatures, the wall surface of the process chamber can be maintained at low temperatures. Therefore, it becomes possible to avoid damage in the process chamber and to reduce emission of contaminant substances from the process chamber, thereby enabling stable heating of the substrate.

Moreover, because the process chamber is maintained at low temperatures, the degree of freedom is improved in selecting materials that constitute the process chamber. For this reason, it becomes possible to configure the process chamber by using a material such as quartz having small dielectric loss (permittivity), and reduced emission of contaminant substances, and thus the epitaxial growth is carried out by stably decomposing the source gases.

Moreover, because the thermal insulation member is arranged in the process chamber where the film deposition gases are decomposed, it is preferable to employ a stable and clean (highly purified) material that is less likely to discharge the contaminant substances when being heated and be decomposed or altered. Specifically, the above thermal insulation member is preferably made of carbon. In addition, the insulation performance can be enhanced by, for example, making carbon porous (increasing porosity).

Next, an example of a configuration of a film deposition apparatus and a method employing the film deposition apparatus are explained in the following with reference to the drawings.

Example 1

Figure 3:
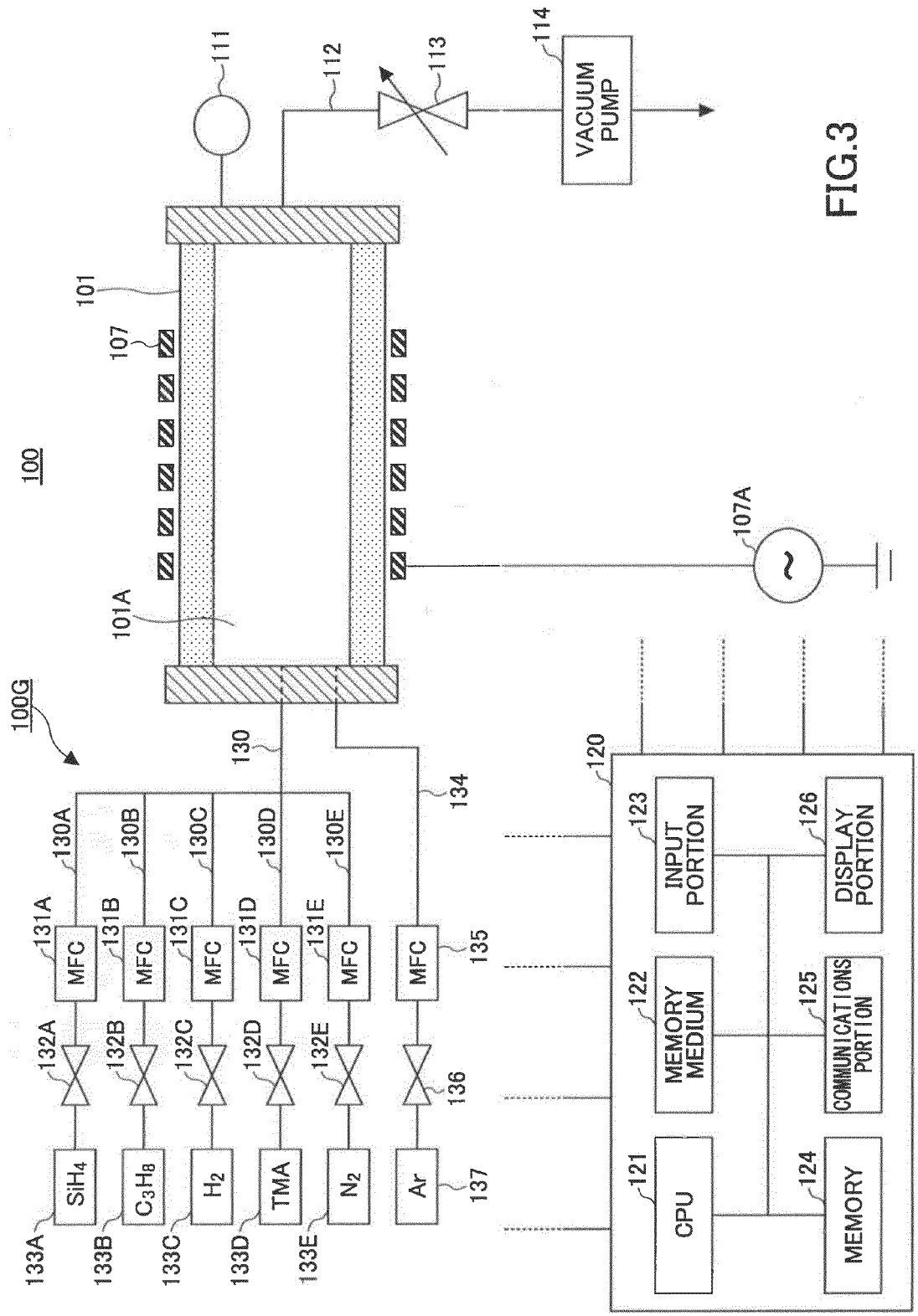
FIG. 3 is a schematic view illustrating a film deposition apparatus according to an example 1 of the present invention.

FIG. 3 is a schematic view illustrating a film deposition apparatus 100 according to an example 1 of the present invention. Referring to FIG. 3, the film deposition apparatus 100 has a process chamber 101 having a shape of substantially a rectangular solid (a substantial tubular shape), inside which a reduced pressure space 101A is defined.

In the reduced pressure space 101A, there is a substrate holding portion that holds a substrate (not shown in FIG. 3, but shown in detail in FIG. 4), where a semiconductor film is grown on the substrate held on the substrate holding portion. An inner structure of the reduced pressure space 101A is omitted in FIG. 3, but shown in detail in FIG. 4 and the subsequent drawings.

In addition, the process chamber 101 is connected with an evacuation line 112 provided with a pressure adjuster 113 composed of, for example, a conductance variable valve, and an evacuation apparatus 114 such as a vacuum pump, and thus the pressure of the reduced pressure space 101A can be adjusted at a pressure (reduced pressure) lower than atmospheric pressure. Moreover, the process chamber 101 is provided with a pressure gauge 111, and thus the pressure of the reduced pressure space 101A is adjusted by the pressure adjuster 113 in accordance with a pressure value measured by the pressure gauge 111.

Furthermore, a coil 107 connected to a high frequency wave power supplier 107A is arranged outside the process chamber 101. High frequency wave power is applied to the coil 107 from the high frequency wave power supplier 107A, and thus the substrate holding portion (not shown) in the reduced pressure space 101A is inductively heated.

In addition, film deposition gases as raw materials for film deposition are supplied into the process chamber 101 (the reduced pressure space 101A) by a gas supplying portion 100G. The gas supplying portion 100G has a gas line 130, and a gas line 130A, a gas line 130B, a gas line 130C, a gas line 130D, and a gas line 130E that are connected to the gas line 130.

The gas line 130A having a mass flow controller (MFC) 131A and a valve 132A is connected to a gas supplying source 133A that supplies $SiH_4$ gas, so that the $SiH_4$ gas is supplied to the process chamber 101.

Similarly, the gas lines 130B through 130E provided with mass flow controllers (MFCs) 131B through 131E and valves 132B through 132E, respectively, are connected to corresponding gas supplying sources 133B through 133E. $C_3H_8$ gas, $H_2$ gas, trimethyl aluminum (TMA) gas, and $N_2$ gas are supplied from the gas supplying sources 133B through 133E, respectively.

For example, when a film (SiC film) having Si and C as primary constituents is epitaxially grown on the substrate in the process chamber 101, $SiH_4$ gas, $C_3H_8$ gas, which are the film deposition gases as the raw materials for the film deposition, and $H_2$ gas are supplied to the process chamber 101, while the substrate is maintained at an appropriate temperature.

In addition, TMA gas and $N_2$ gas may be supplied to the process chamber 101 in addition to $SiH_4$ gas, $C_3H_8$ gas and $H_2$ gas, when necessary, so that electrical properties of the SiC film formed on the substrate may be adjusted. The above gases are merely exemplified as gases to be used for film deposition. The present invention is not limited to the above gases, but other gases may be used to form the SiC film. Moreover, the present invention is not limited to the SiC film, but other films may be formed by using other gases.

Furthermore, cooling gas for cooling the process chamber 101 is supplied to the process chamber 101 (the reduced pressure space 101A) through a gas line 134. The gas line 134 provided with an MFC 135 and a valve 136 is connected to a gas supplying source 137 that supplies the cooling gas (e.g., an inert gas such as argon (Ar)), so that the cooling gas can be supplied into the process chamber 101. Specific supplying routes of the film deposition gases and the cooling gas in the process chamber 101 are described later in reference to FIG. 4.

Film deposition procedures (e.g., operations such as an opening/closing of the valves, a flow rate control, application of high frequency waves, and the like) are carried out in accordance with a program that may be called a recipe in the film deposition apparatus 101. In this case, the operations of the valves, the MFCs and the like are controlled by a control apparatus 120 having a CPU 121. Connection wirings for these components are omitted in the drawings.

The control apparatus 120 has the CPU 121, a memory medium 122 that stores the above program, an input portion 123 such as a keyboard, a display portion 126, a communications portion 125 for connecting to a network and the like, and a memory 124.

Figure 4:
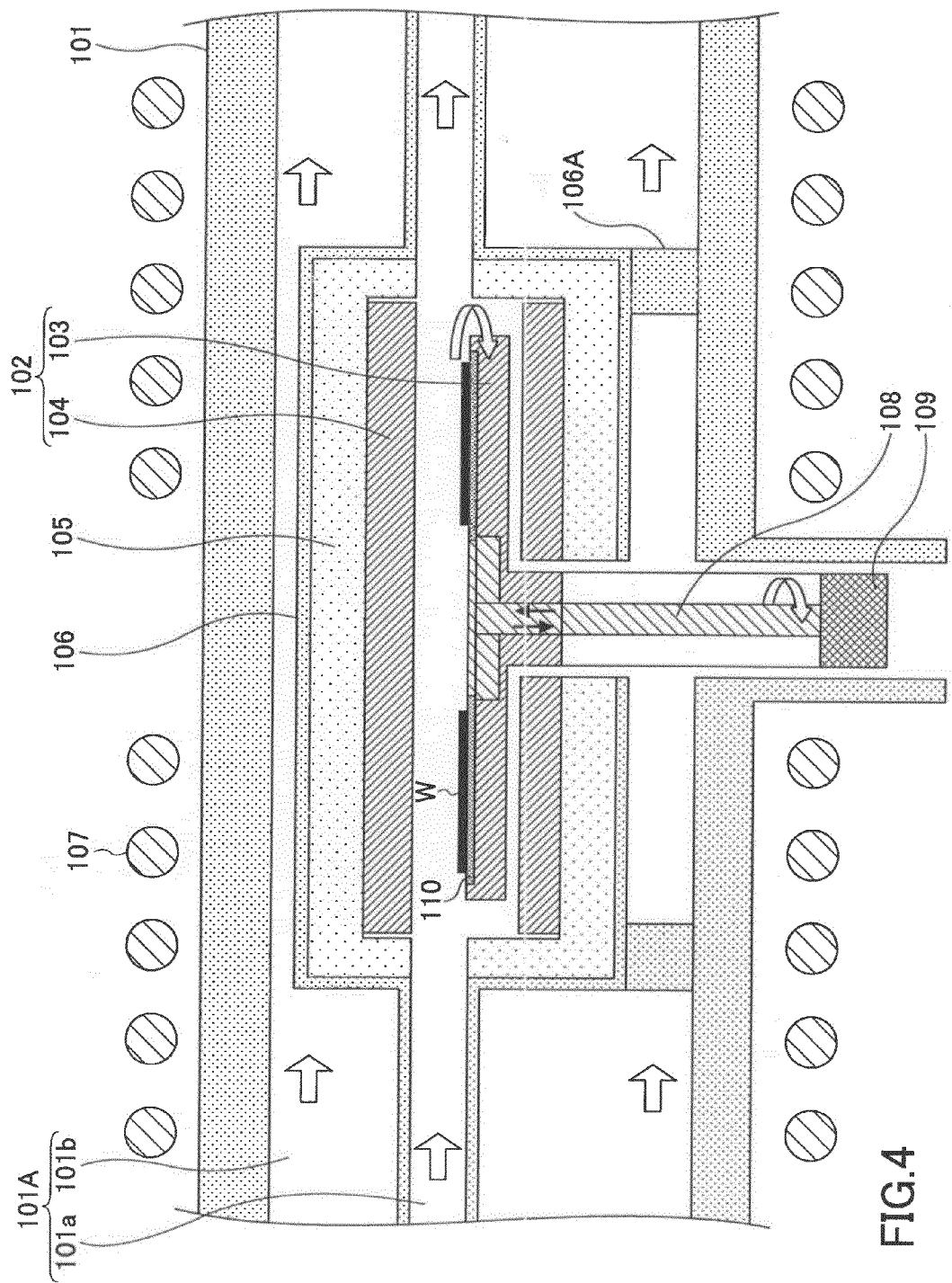
FIG. 4 is a schematic cross-sectional view illustrating an inner configuration of the process chamber of FIG. 3.

Next, a configuration of the process chamber 101 is explained in reference to FIG. 4. FIG. 4 is a schematic cross-sectional view illustrating an inner configuration of the process chamber 101 explained in reference to FIG. 3. The same reference symbols are given to the portions that have been previously explained. Referring to FIG. 4, a substrate holding portion 102 that holds a substrate W in the reduced pressure space 101A is provided inside the process chamber 101.

The substrate holding portion 102 is inductively heated by the coil 107 provided outside the process chamber 101. The substrate W is inductively heated by the coil 107, and also heated through radiation and heat conduction from the substrate holding portion 102. The substrate W is heated at about a temperature that can decompose the film deposition gases so that a surface reaction (epitaxial growth) takes place.

For example, because $C_3H_8$ gas mentioned previously begins to be decomposed at about 1200° C., the substrate W is heated at least 1200° C. or more (e.g., 1550° C. through 1650° C.). In this case, the substrate holding portion 102 is also heated at substantially the same temperature.

A thermal insulation member 105 is provided between the substrate holding portion 102 (substrate W) and the process chamber 101, and thermally insulates the process chamber 101 from the substrate holding portion 102 (substrate W) that is inductively heated to high temperatures.

Therefore, even when the substrate holding portion 102 (substrate W) is heated up to the above-mentioned temperatures, a large temperature difference between the heated portions and the process chamber 101 is maintained, so that damage to the process chamber 101, gas discharging and the like can be suppressed.

In addition, because of an excellent thermal insulation performance between the high temperature portions in the process chamber 101 and the process chamber 101, the degree of freedom in choosing a material of the process chamber 101 is enhanced. The process chamber 101 is made of, for example, quartz. Because quartz has a low dielectric loss and is not inductively heated, quartz is preferable as the material for the process chamber 101. In addition, because quartz may have high purity, and discharge a lesser amount of the emission gas that may contaminate the film even when being heated in a reduced pressure environment, quartz is preferable as the material that defines the reduced pressure space when the film that becomes a part of a high performance device is formed.

Moreover, the thermal insulation member 105 and the substrate holding portion 102 that are heated at high temperatures in the reduced pressure space 101A are preferably made of a stable, purified material (having a high purity) that is less likely to discharge contaminant substances when being heated. For example, the substrate holding portion 102 and the thermal insulation member 105 are both preferably formed of carbon (graphite).

Furthermore, the substrate holding portion 102 is preferably made of a high density carbon material, so that the substrate holding portion 102 is easily heated by inductive heating and can heat the substrate through radiation. Such a carbon material preferably has as high density as is referred to as a bulk material.

On the other hand, the thermal insulation member 105 is preferably formed of a low density carbon material in order to enhance thermal insulation performance. Such a carbon material preferably has an extremely greater porosity than the above bulk material. Specifically, such a carbon material preferable for thermal insulation has voids that can be, for example, visually observed. Such a carbon material may be recited here as a porously formed material, regardless of a shape of the voids in this specification.

In addition, the thermal insulation member 105 may be made of a carbon material that includes a substance for controlling the thermal conductivity of carbon at a level where the film formed on the substrate is not contaminated, when necessary.

Namely, while the substrate holding portion 102 and the thermal insulation member 105 are both made of the same material (carbon) as the primary constituents, which can preferably be heated in a reduced pressure environment, these carbons are different in terms of thermal conductivities, which is caused mainly by a difference of the densities (micro structure of the materials).

In addition, a predetermined coating film may be coated on the surfaces of the substrate holding portion 102 and the thermal insulation member 105. In this example, the surface of the substrate holding portion 102 is coated with a SiC film, while the surface of the thermal insulation member 105 is coated with a carbon film having a higher density than the density of the thermal insulation member 105. By coating such coating films, the material is protected, and particle generation and reaction with the gases can be suppressed.

Moreover, a thermal insulation member holding structure 106 is formed outside the thermal insulation member 105 in order to cover the thermal insulation member 105. The thermal insulation member holding structure 106 is configured to hold the thermal insulation member 105 separated from the process chamber 101. For this reason, a thermal insulation space 101b is defined between the process chamber 101 and the thermal insulation member 105, thereby effectively suppressing a rise in temperature of the process chamber 101. The thermal insulation member holding structure 106 is supported by a pillar-shaped supporting portion 106A placed on a bottom surface of the process chamber 101.

In addition, the cooling gas (e.g., Ar gas) is supplied to the thermal insulation space 101b from the gas line 134 (FIG. 3). Such gas cooling also suppresses a rise in temperature of the process chamber 101.

Moreover, the film deposition gases are supplied from the gas line 130 (FIG. 3) to a film deposition gas supplying space 101a that is defined inside the thermal insulation member holding structure 106 and where the substrate holding portion 102 and the thermal insulation member 105 are located. Namely, the film deposition gases are prevented from diffusing in the reduced pressure space 101A by the thermal insulation member holding structure 106, thereby efficiently supplying the film deposition gases to the substrate W. Such a configuration contributes to an improved usage efficiency of the film deposition gases.

In other words, the thermal insulation member holding structure 106 separates the reduced pressure space 101A into substantially two spaces (the film deposition gas supplying space 101a, and the thermal insulation space 101b). Therefore, the temperature increase of the process chamber 101 can be effectively reduced, and the usage efficiency of the film deposition gases is improved. Moreover, because the above cooling medium is supplied to the thermal insulation space 101b defined between the substrate holding portion 102 and the process chamber 101, the rise in temperature of the process chamber 101 can be effectively reduced, in addition to the substrate holding portion 102, which is heated to high temperatures, being separated from the process chamber 101 by the thermal insulation member 105.

Moreover, referring to FIG. 4, the substrate holding portion 102 has a susceptor 103 on which the substrate W is placed and a structure-to-be-heated 104 arranged around the susceptor 103.

The susceptor 103 is substantially disk-shaped and has a concave portion in the upper surface. A substantially disk-shaped transfer plate 110 on which plural substrates W are placed is placed in the concave portion. The plural substrates W are placed on the transfer plate 110, and the transfer plate 110 on which the plural substrates W are placed is transferred and placed in the concave portion of the susceptor 103 by a transfer portion such as a transfer arm (described later).

In addition, the susceptor 103 is configured so that a shaft portion 108 is inserted into a center hole formed in the center portion of the susceptor 103. The shaft portion 108 is movable upward or downward and rotatable by a driving portion 109 provided at the bottom end of the shaft portion 108. A substantially disk-shaped distal end portion is formed to be stepwise as a whole at the upper end of the shaft portion 108. The distal end portion may be fitted with the center hole formed at the center portion of the transfer plate 110 in order to raise the transfer plate 110. At the time of transferring the transfer plate 110, the transfer plate 110 is raised by the shaft portion 108.

Moreover, at the time of film deposition, the transfer plate 110 is rotated around the shaft portion 108 as a center axis. Therefore, across-the-wafer variations and wafer-to-wafer variations in terms of film deposition rate, film thickness, and film properties are reduced.

Figure 5:
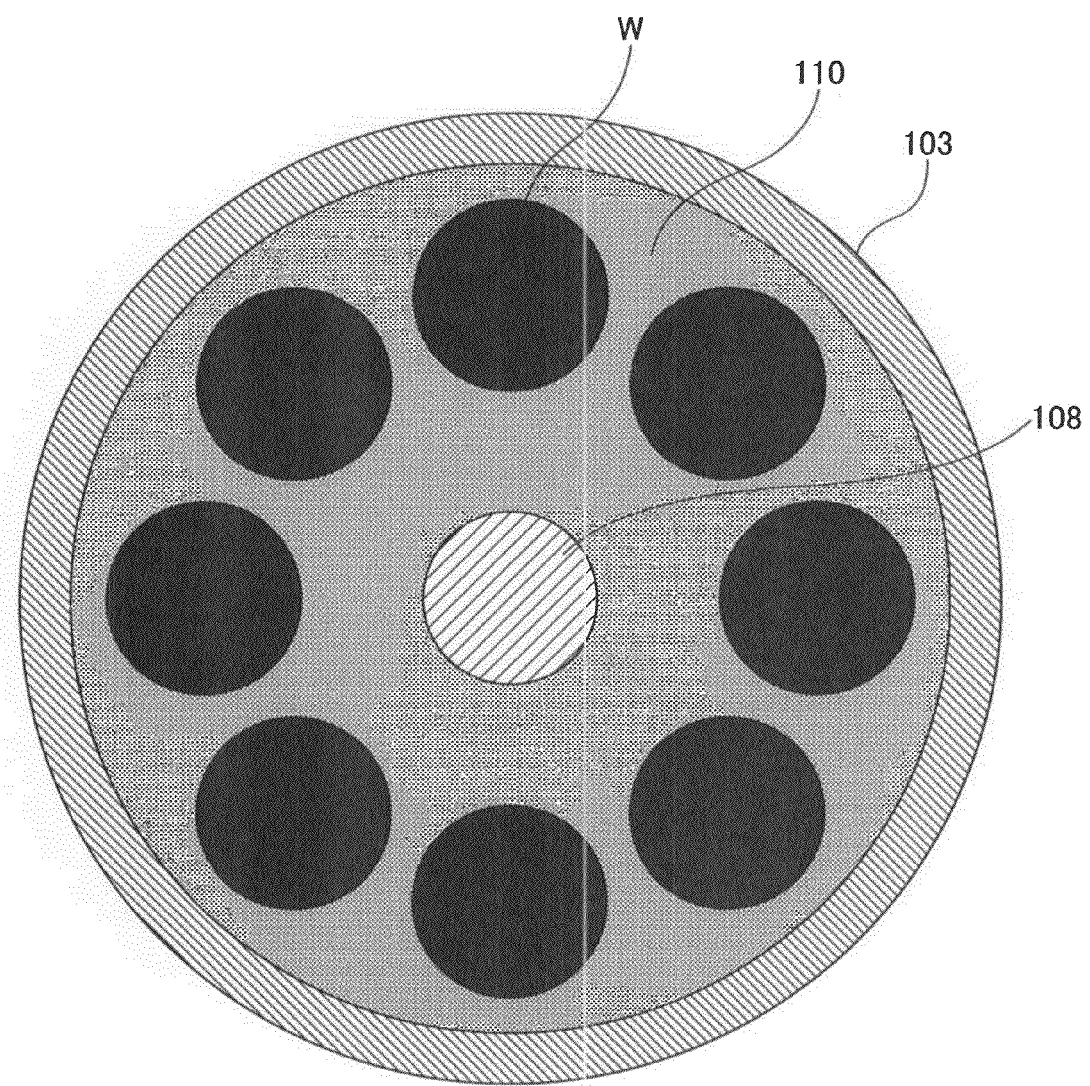
FIG. 5 is a schematic view illustrating a substrate holding portion arranged inside the process chamber of FIG. 4.

FIG. 5 is a plan view illustrating the transfer plate 110 placed on the susceptor 103, and the plural substrates W placed on the transfer plate 110. In addition, the distal end portion of the shaft portion 108 is fitted with the center hole of the transfer plate 110. Although this drawing illustrates eight substrates W placed at the equal angular intervals as one example, the number of the substrates and positions where the substrates are placed are not limited to the example shown in the drawing. The transfer plate 110 is preferably formed of the same material (carbon) as the susceptor 103 because the transfer plate 110 is inductively heated in the reduced pressure space 110A.

Figure 6:
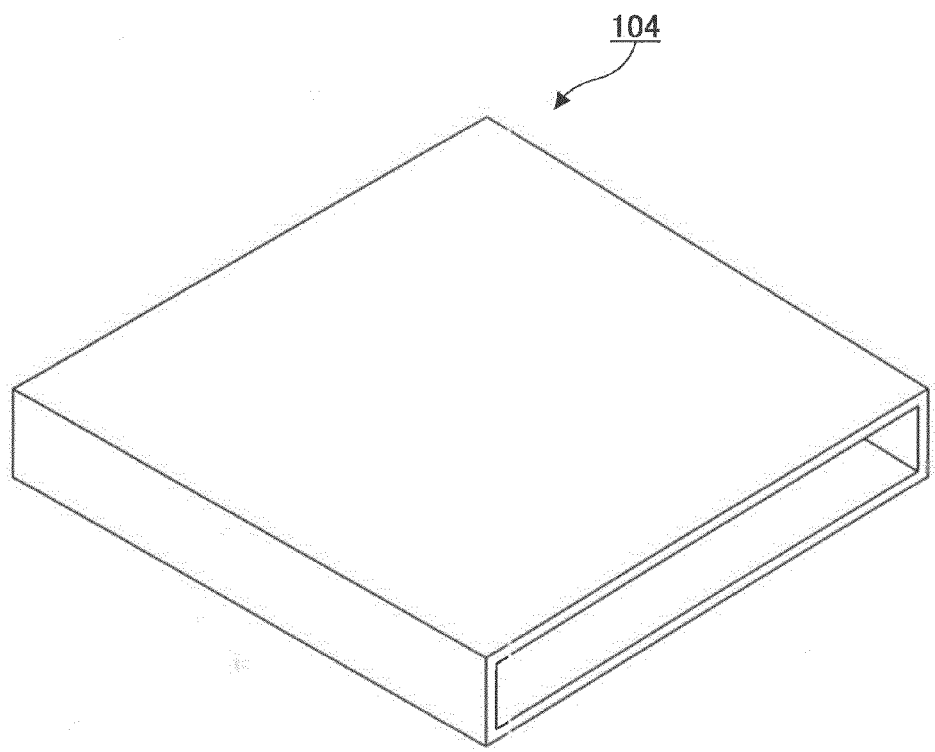
FIG. 6 is another schematic view illustrating the substrate holding portion arranged inside the process chamber of FIG. 4.

FIG. 6 is a perspective view illustrating the structure-to-be-heated 104 that along with the susceptor 103 constitutes the substrate holding portion 102. Referring to FIG. 6, the structure-to-be-heated 104 is substantially tubular-shaped (rectangular-solid-shaped), for example. The structure-to-be-heated 104 is arranged around the susceptor 103 in order to surround the susceptor 103.

In addition, the structure-to-be-heated 104 has two openings corresponding to two opposing surfaces of the rectangular solid shape, and is arranged so that the film deposition gases are supplied from one of the two openings and evacuated from the other opening. With such a configuration, the film deposition gases supplied to the film deposition gas supplying space 101a (FIG. 4) flow substantially in a direction parallel to the substrates W and are evacuated from the process chamber 101.

In the film deposition apparatus 100 according to this example, because the structure-to-be-heated 104 is arranged, in addition to the susceptor 103 on which the substrates W are placed, inside the process chamber 101, the substrates W can be highly effectively heated with an improved uniformity. For example, the substrates W are inductively heated, and also heated through radiation from the susceptor 103 (the transfer plate 110). In addition, because the structure-to-be-heated 104 having a larger mass than the susceptor 103 and the transfer plate 110 is provided, the substrates W are more effectively heated. Furthermore, the substrates W are heated from the surroundings of the substrates W (from plural directions) through radiation from the structure-to-be-heated 104. Therefore, the substrates W are more uniformly heated.

In addition, the induction heating by the coil 107 is capable of efficiently heating the substrates W with excellent uniformity. In this case, the coil 107 is preferably arranged so that the coil 107 is wound around the process chamber 101. With this, the substrates W can be heated with better uniformity. Moreover, when the coil 107 is used in combination with the structure-to-be-heated 104, the substrates W can be more efficiently heated with far better uniformity.

Figure 7:
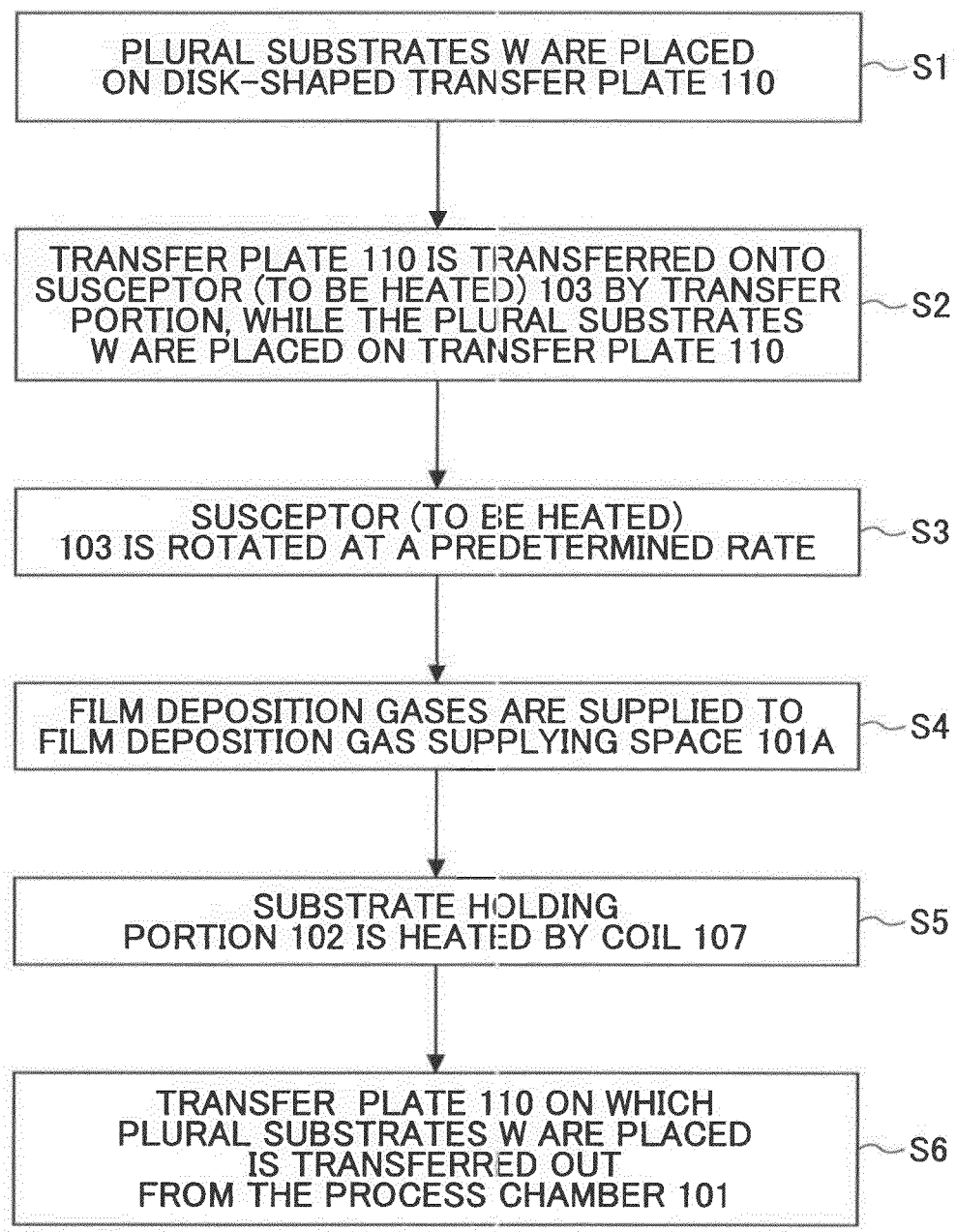
FIG. 7 is a flowchart illustrating a film deposition method.

Next, one example of a film deposition method using the film deposition apparatus 100 is explained in reference to a flowchart shown in FIG. 7. In performing film deposition, the transfer plate 110 on which the plural substrates W are placed is transferred by the transfer portion (e.g., the transfer arm), which is described later in reference to, for example, FIG. 8 and the subsequent drawings.

First, the plural substrates W are placed on the disk-shaped transfer plate 110 at step S1.

Next, the transfer plate 110 on which the plural substrates W are placed is transferred onto the susceptor (susceptor-to-be-heated) 103 by the transfer portion (later described) at step S2.

The susceptor-to-be-heated 103 and the transfer plate 110 held by the susceptor-to-be-heated 103 are rotated at a predetermined rate at step S3.

Next, the film deposition gases are supplied to the film deposition gas supplying space 101a at step S4.

Next, high frequency wave power is applied to the coil 107 from the high frequency wave power supplier 107A, and the substrate holding portion 102, the transfer plate 110, and the substrates W are inductively heated at step S5.

Next, the transfer plate 110 on which the substrates W are placed is transferred out from the process chamber 101 by the transfer portion at step S6.

In such a manner, the film (SiC film) having Si and C as primary constituents can be epitaxially grown on the substrates W. In addition, when the film deposition gases are supplied at step S4, $SiH_4$ gas, $C_3H_8$ gas, and $H_2$ gas as the film deposition gases are supplied to the process chamber 101 (film deposition gas supplying space 101a). In addition, TMA gas and $N_2$ gas may be also supplied, when necessary.

For example, when flow rates of the film deposition gases are exemplified, a flow rate of $SiH_4$ gas is 10 sccm through 30 sccm; a flow rate of $C_3H_8$ gas is 10 sccm through 20 sccm; and a flow rate of $H_2$ gas is 50 slm through 200 slm. The flow rates are not limited to these values.

In addition, when the substrate holding portion 102 (substrates W) is inductively heated by the coil 107 arranged outside the process chamber 101 at step S5, the substrates W are heated at temperatures of about 1550° C. through about 1650° C.

Moreover, steps S3 through S5 may be permuted, or may be carried out substantially at the same time. Furthermore, by arbitrarily changing a period of time required for each step, the SiC film having a desired thickness can be formed.

Next, an example of configuring a film deposition apparatus by connecting a transfer chamber to the process chamber 101. For example, when a semiconductor device is formed on a substrate, the transfer chamber is generally used that transfers the substrate (a transfer plate on which the substrate is placed). Therefore, the film deposition apparatus is configured to have the transfer chamber as explained in the following.

Figure 8:
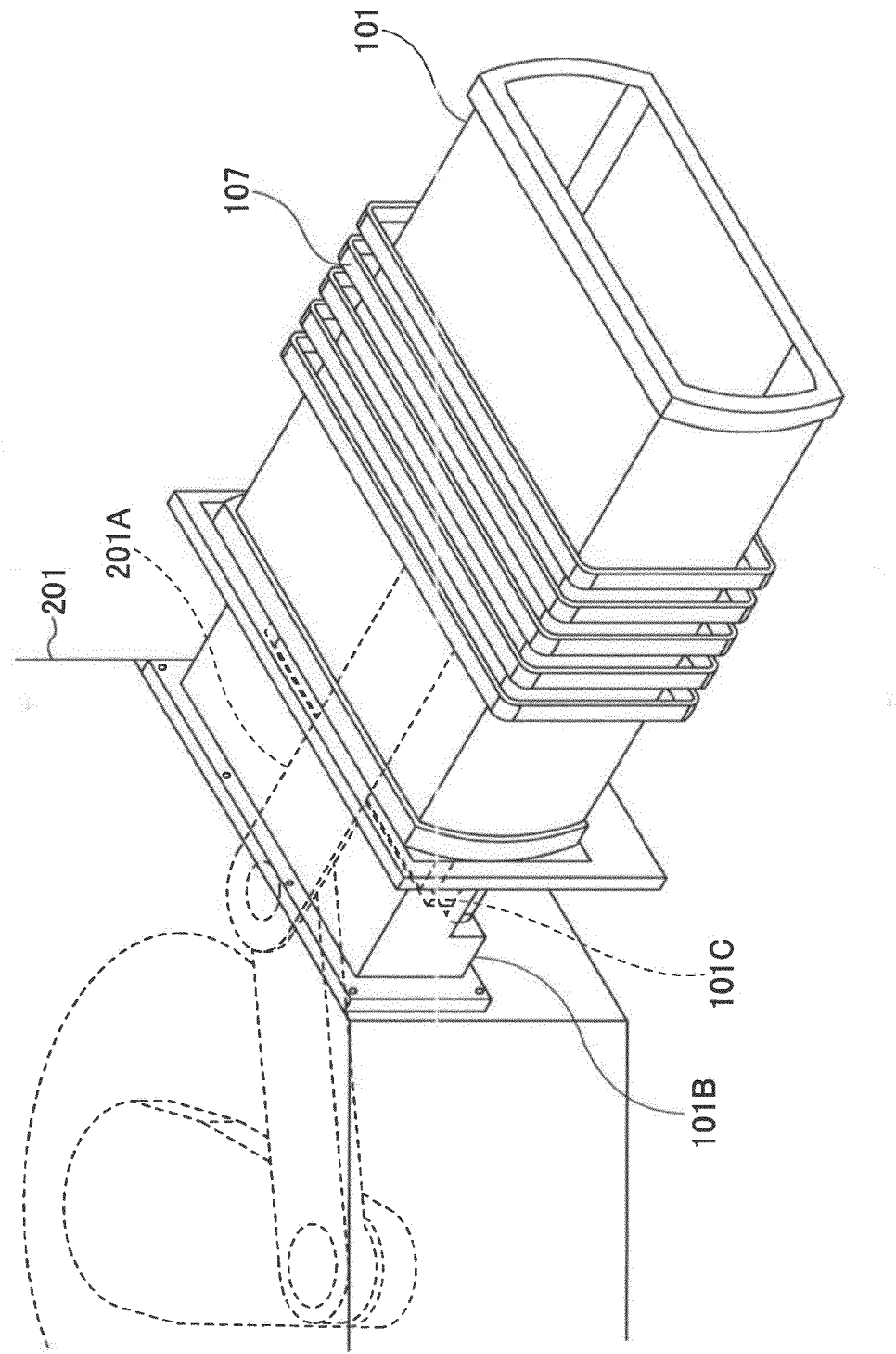
FIG. 8 is a view illustrating an example of connecting a transfer chamber to a process chamber.

FIG. 8 is a schematic perspective view illustrating an example of configuring the film deposition apparatus by connecting a transfer chamber 201 having a transfer arm (transfer portion) 201A to the process chamber 101. The same reference symbols are given to the portions that have already been explained, and detailed explanations are omitted. In FIG. 8, the inner configuration of the process chamber 101, the evacuation line connected to the process chamber 101 and the like are omitted.

Referring to FIG. 8, the process chamber 101 that has been explained in reference to FIGS. 4 and 5 is connected to the transfer chamber 201 via a process chamber 101B. A gas nozzle (film deposition gas supplying portion) 101C for supplying the film deposition gases is provided under the process chamber 101B. The film deposition gases are supplied to the film deposition gas supplying space 101a (FIG. 4) from the gas nozzle 101C.

In the above configuration, the transfer plate 110 (FIG. 5) on which the substrates W are placed is transferred into the process chamber 101 from the transfer chamber 201 by the transfer arm 201A. Namely, the transfer plate 110 is slotted into the film deposition gas supplying space 101a (FIG. 4) by the transfer arm 201A, and placed on the susceptor 103 (omitted in this drawing). In addition, after film deposition onto the substrates W is finished, the transfer plate 110 is transferred out from the process chamber 101 to the transfer chamber 201 similarly by the transfer arm 201A.

FIG. 9 is a schematic plan view illustrating an example of configuring a substrate process apparatus 1000 by connecting plural process chambers 101 (process apparatuses 100) to the transfer chamber 201. The same reference symbols are given to the portions that have already been explained, and the explanations are omitted.

Referring to FIG. 9, the substrate process apparatus 1000 has ports 205A through 205C in which holders (not shown) are placed, the holders having the transfer plates 110 placed on the holders, and a loader 203 which corresponds to a transfer area of the holders.

In addition, the loader 203 is connected to load locks 202A, 202B to which the transfer plates 110 are transferred. The load locks 202A, 202B are connected to the transfer chamber 201 that has already been explained in reference to FIG. 8.

The two process chambers 101 shown previously are connected to the transfer chamber 201. Other configurations of the process chambers 101 (the coil, the high frequency wave power supplier, the evacuation line, the gas line, and the like) except for the process chambers 101 are omitted in the drawing.

The transfer plate 110 (substrates W) placed in any one of the ports 205A through 205C is transferred into the load lock 202A or the load lock 202B via the loader 203. In addition, the transfer plate 110 is further transferred into the film deposition apparatus 100 (process chamber 101) from any one of the load locks 202A, 202B through the transfer chamber 201. Moreover, the transfer plate 110 may be aligned using an alignment mechanism 204 that is provided in the loader 203.

After the film deposition is finished in the film deposition apparatus 100, the transfer plate 110 (substrates W) is transferred back to either one of the load locks 202A, 202B via the transfer chamber 201, and further back to any one of the ports 205A through 205C via the loader 203.

In such a manner, the film deposition onto the substrates can be successively and efficiently carried out by connecting configurations, such as the transfer chamber 201, for transferring the transfer plate 110 (substrate W) to the film deposition apparatus 100 (process chamber 101).

In addition, the substrate process apparatus 1000 is not limited to the above configuration, but may be altered or modified in various ways. For example, the number of the film deposition apparatuses 100 (process chambers 101) connected to the transfer chamber 201 is not limited to two. For example, three or four film deposition apparatuses 100 may be connected. Moreover, other apparatuses where other substrate processes are carried out, rather than the film deposition apparatus 100, may be connected to the transfer chamber 201. In such a manner, the configuration of the substrate process apparatus 1000 may be modified, when necessary, thereby making it possible to improve substrate process (film deposition) efficiency.

Although the present invention has been explained in reference to preferred examples, the present invention is not limited to the above specific examples, but may be modified or altered within the scope recited in the accompanying claims.

This international application claims priority based on a Japanese Patent Application No. 2006-348502 filed on Dec. 25, 2006, and the entire content of which is incorporated herein by reference.

INDUSTRIAL APPLICABILITY

According to the present invention, a film deposition apparatus and a film deposition method that are capable of stably decomposing film deposition gases having high decomposition temperatures by using induction heating in order to perform film deposition.

The invention claimed is:

1. A film deposition apparatus comprising:
   a process chamber inside which a reduced pressure space is maintained;
   a substrate holding portion that is made of a material including carbon as a primary constituent and holds a substrate wherein the substrate holding portion includes a susceptor by which a plurality of substrates can be supported and a structure-to-be-heated that is placed so as to surround the susceptor;
   a coil that is arranged outside the process chamber and inductively heats the substrate holding portion;
   a thermal insulation member holding structure that allows a thermal insulation member that covers the substrate holding portion to be away from the process chamber,
   wherein the thermal insulation member holding structure separates the reduced pressure space into a film deposition gas supplied space and a thermal insulation space,
   wherein the film deposition gas supplied space is provided with the substrate holding portion and the thermal insulation member, and
   wherein the thermal insulation space is defined between the process chamber and the thermal insulation member;
   a gas supplying portion that supplies a film deposition gas to the film deposition gas supplied space; and
   a gas line that supplies a cooling gas for cooling the process chamber to the thermal insulation space,
   wherein the cooling gas is provided to the thermal insulation space and is unmixed with the film deposition gas, which is provided to the film deposition gas supplied space.

2. The film deposition apparatus recited in claim 1, wherein the thermal insulation member is made of a porous material including carbon as a primary constituent, thereby differentiating a thermal conductivity of the thermal insulation member from a thermal conductivity of the substrate holding portion.

3. The film deposition apparatus recited in claim 2, wherein a carbon-based coating film is formed on a surface of the thermal insulation member.

4. The film deposition apparatus recited in claim 1, wherein the process chamber is made of quartz.

5. The film deposition apparatus recited in claim 1,
   wherein the structure-to-be-heated includes two openings opposing each other, and
   wherein the film deposition gas is supplied from one of the two openings and evacuated from the other opening such that the film deposition gas supplied to the film deposition gas supplied space flows substantially in a direction parallel to the substrate.

6. The film deposition apparatus recited in claim 5, wherein the susceptor holds a transfer plate on which the plural substrates are placed, and
   wherein the susceptor is configured to rotate the transfer plate around a predetermined rotation axis.

7. The film deposition apparatus recited claim 6, wherein the process chamber is connected to a transfer chamber having inside thereof a transfer portion, and
   wherein the transfer plate is transferred onto or out from the susceptor by the transfer portion.

8. The film deposition apparatus recited in claim 1, wherein a film corresponding to the film deposition gas is formed on the substrate.

9. The film deposition apparatus recited in claim 1, wherein a portion of the structure-to-be-heated faces the susceptor and is spaced apart from the susceptor by a first distance.

10. The film deposition apparatus recited in claim 9, wherein the structure-to-be-heated is free from contact with the process chamber.

11. The film deposition apparatus recited in claim 1, wherein the thermal insulation member is free from contact with the process chamber.

12. The film deposition apparatus recited in claim 1, wherein
   the film deposition gas supplied to the film deposition gas supplied space contacts an inner surface of a portion of the thermal insulation member holding structure,
   the cooling gas supplied to the thermal insulation space contacts an outer surface of the portion of the thermal insulation member holding structure, and
   the inner surface of the portion of the thermal insulation member holding structure is opposite the outer surface of the portion of the thermal insulation member holding structure.

* * * * *